United States Patent [19]

Hamilton et al.

[11] Patent Number: 6,011,539

[45] Date of Patent: Jan. 4, 2000

[54] TELEVISION ON-SCREEN DISPLAY SYSTEM UTILIZING TEXT DATA COMPRESSION

[75] Inventors: Thomas H. Hamilton; Kenneth Wayne Maze, both of Indianapolis, Ind.

[73] Assignee: Thomson Consumer Electronics, Inc., Indianapolis, Ind.

[21] Appl. No.: 08/757,687

[22] Filed: Dec. 3, 1996

Related U.S. Application Data

[63] Continuation of application No. 08/366,416, Dec. 29, 1994, abandoned.

[51] Int. Cl.[7] .................................................. H04N 5/445
[52] U.S. Cl. .............................. 345/141; 348/569; 341/90
[58] Field of Search .................................... 345/141, 143, 345/192, 193, 194, 195, 26, 27, 28; 348/569, 570, 589; 341/90, 106; 358/444; H04N 5/44, 5/445

[56] References Cited

U.S. PATENT DOCUMENTS

| | | | |
|---|---|---|---|
| 4,701,744 | 10/1987 | DeVilbiss | 341/90 |
| 5,151,954 | 9/1992 | Takai et al. | 345/141 |
| 5,225,833 | 7/1993 | Fisher et al. | 341/90 |
| 5,343,307 | 8/1994 | Mizuno et al. | 358/444 |

FOREIGN PATENT DOCUMENTS

| | | | |
|---|---|---|---|
| 0340643 | 11/1989 | European Pat. Off. | H04N 5/445 |
| 0589068 | 3/1994 | European Pat. Off. | H04N 5/445 |
| 0605026 | 7/1994 | European Pat. Off. | H04N 5/445 |
| 0682452 | 11/1995 | European Pat. Off. | H04N 5/445 |

OTHER PUBLICATIONS

Microsoft Word for Macintosh, User's Guide Copyright 1991 Microsoft Corporation, USA, pp. 140–141, "Changing the Case of Characters".

"Common Phrases and Minimum–Space Text Storage" pp. 148–152, By Robert A.Wagner, Cornell University; Programming Techniques/Communications of the ACM, Mar. 1973, vol. 16, No. 3.

"Binary–Coded Text a Text–Compression Method" by Dr. R. Tropper, pp. 398–413, BYTE Publications, Inc. Apr., 1982.

*Primary Examiner*—David E. Harvey
*Attorney, Agent, or Firm*—Joseph S. Tripoli; Peter M. Emanuel

[57] ABSTRACT

An on-screen display system for displaying instructions for guiding a user to utilize various features of a consumer electronics product such as a television receiver or VCR, includes a memory for storing both uncompressed text data and compressed text data, and an associated microprocessor for retrieving the text data, decompressing it if necessary, and presenting it to a display buffer. Text data compression is in part accomplished by a dictionary containing text data representing commonly used text "strings" comprising one or more words which is stored in the memory. Code words related to the location of respective dictionary entries in memory are substituted for respective uncompressed text data. Text data compression is also accomplished by substituting a format change code word indicating that adjacent text data representing a first string of text with a first format, such as all lower case or mixed case, is to be converted to text data representing a second string of text with a second format, such as all upper case or title case. In this way, text data representing text differing only in format only needs to be stored once. The format change code word is employed both in the uncompressed text data portion of the memory and in the dictionary portion of the memory and the text data, whether uncompressed or compressed, is retrieved and formatted for display in the same manner.

20 Claims, 3 Drawing Sheets

TELEVISION ON-SCREEN DISPLAY SYSTEM UTILIZING TEXT DATA COMPRESSION

This is a continuation of application Ser. No. 08/366,416, filed Dec. 29, 1994, now abandoned.

FIELD OF THE INVENTION

The invention concerns a method and an apparatus for text data compression which are particularly well suited for use in an on-screen display system for a consumer electronics product which employs a computer based control system with a relatively small memory.

BACKGROUND OF THE INVENTION

Sophisticated features are increasingly being employed in consumer electronics products such as television receivers, satellite receivers, video cassette recorders (VCRs) and camcorders. While such features increase the consumer's satisfaction with the product, they tend to be complicated to use. Accordingly, so called "on-screen" display (OSD) systems are also increasingly being employed in consumer electronics products to display instruction, status and other information via a viewing screen to facilitate the use of the features. Often, the OSD system displays text menus which are sequentially accessed in a hierarchical manner to guide the consumer to utilize the features in a systematic way.

The data representing the text which is to be displayed is stored in a read-only memory (ROM) either incorporated within or external to a microprocessor used to control the operation of the consumer electronics product. Text data can utilize a large amount of memory, especially in the case of hierarchical menus. The size of a memory is directly related to its cost, and therefore it is important to limit the amount of text data that must be stored in order to keep the cost of the consumer electronics product as low as possible. It is also important to limit the amount of text data in order to maximize the amount of memory available for control functions and features.

Text data compression techniques are known for reducing the amount of text data which must be stored. For example, text data is usually stored in what is known as ASCII code or format, in which each text character is represented by a unique eight bit word or byte. Statistical coding techniques, such as Huffman coding, can be utilized so that less than eight bits can be used to represent the most common characters. This type of coding often results in a very high compression ratio (amount of compressed text/amount of raw text). However, the compressed text data is not easily recognizable for decompression (decoding) since it is no longer in an ASCII-like format (i.e., is no longer an eight-bit word).

Another compression technique involves the use of a dictionary of common words or phrases. Each entry of the dictionary is represented by a unique code word, for example, of eight bits corresponding to a non-ASCII word, and is used to replace the word or phrase in the ultimately stored text data.

SUMMARY OF THE INVENTION

The present invention stems from the recognition that text compression may be achieved by replacing text data representing a second text "string" (comprising a single word or a series of words) which is identical to a first text string except for a difference in format, such as case, by a format change code word which indicates how to modify the first text string to produce the second text string. In one example of a case format change, the difference in case may correspond to the second text string being an upper case version of a first text string which is in lower case or in mixed case. In another example, the difference in case may correspond to the second text string being a "title case" version (first letter of each word capitalized) of a first text string which is in lower case or in mixed case. Such a text data compression technique is beneficial when codes such as ASCII, in which lower case and upper case versions of the same letter are represented by different eight-bit codes, are employed and different case versions of the same text string are to be displayed in one or more on-screen messages.

Another feature of the invention concerns the manner in which the case text compression technique referred to above may be integrated with other text data compression techniques, such as the dictionary text data compression technique.

These and other features of the invention will be described with reference to the accompanying Drawing.

DESCRIPTION OF THE PREFERRED EMBODIMENT OF THE INVENTION

Figure 1:
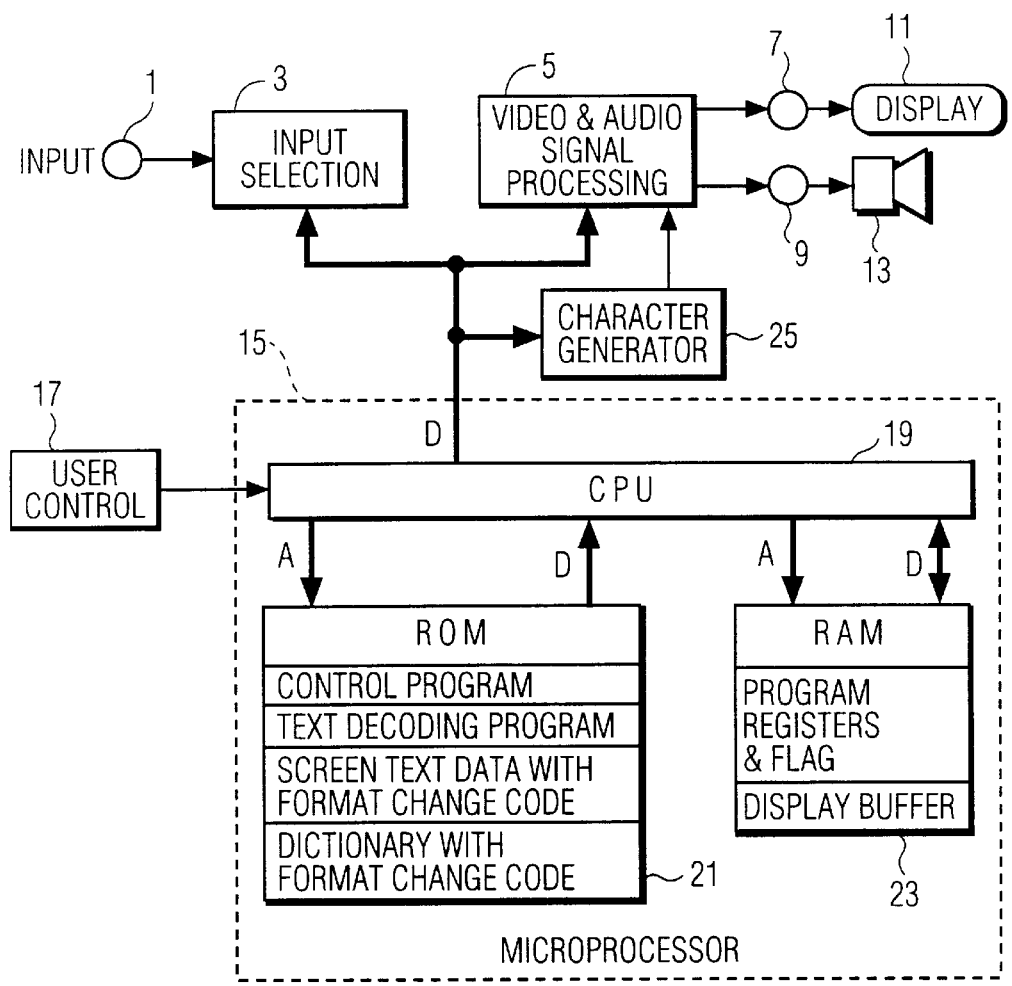
FIG. 1 is a block diagram of a television receiver including an "on-screen" display (OSD) system constructed in accordance with an aspect of the present invention.

The television receiver shown in FIG. 1 includes an input 1 for receiving a plurality of television signals, an input selection unit 3 for selecting one of the plurality of received television signals and deriving video and audio signals from the selected television signal, a signal processing section 5 for processing the video and audio signals, and video and audio outputs 7 and 9 at which the processed video and audio signals are provided. The processed video and audio signals provided at respective ones of outputs 7 and 9 are coupled to respective ones of a display unit 11 and a sound reproducing unit 13.

The various functions of input selection unit 3 and signal processing unit 5 and, in general, various "features" of the television receiver, are controlled by a microprocessor or microcomputer 15 in response to control signals received from a user control unit 17. User control unit 17 may include a remote control transmitter and a remote control receiver (not shown). Microprocessor 15 includes a central processing unit (CPU) 19, read only memory (ROM) 21 and random access memory (RAM) 23. ROM 21 stores the control program and other data for controlling the television receiver and is addressed by address (A) words generated by CPU 19. Data (D) stored in ROM 21 is coupled to CPU where it is processed. RAM 23 temporarily stores data processed by CPU 19. While ROM 21 and RAM 23 are indicated as being integrally included within the same integrated circuit as CPU 21 by a dashed line surrounding them, either one or both of ROM 21 and RAM 23 may be separate units.

The television receiver shown in FIG. 1 may be a "television set" in which display unit 11 and sound reproducing unit 13 are integrally included within the "set", or a video cassette recorder (VCR), in which case display unit 11 and sound reproducing unit 13 are included in an associated external television set. In the latter case, the video and audio signals may be coupled to the external television set directly in the form of baseband signals or may be modulated on to an RF carrier which is coupled to a RF input of the external television set. The television receiver may comprise a conventional television receiver which receives RF signals transmitted by a terrestrial broadcast station or provided by a cable distribution network, a satellite television receiver which receives microwave signals transmitted from a satellite in earth orbit or a television receiver which receives televisions signals from a telephone network.

Modern versions of each of the types of television receivers indicated above has a very large number of relatively complex control functions and features which are controllable by a user. To facilitate the use of these functions and features, the television receiver shown in FIG. 1 includes a character generator 25 for generating character representative signals for causing display unit 11 to display text instructions, status and other information to guide the user. The character signals are coupled to signal processing section 5 where they are inserted into the video signal which is coupled display unit 11. The character signals are generated in response to text data stored in ROM 21 of microprocessor 15, as will be described below.

The text information which is displayed at any one time is called a text "screen". Each screen comprises a number of text strings which may be as short as one text word or as long as several lines. Each text character is represented by a unique character representative code word. By way of example, each character may be represented in well known eight-bit (one byte) ASCII code. The text data for the screens is stored in a "screens" portion of ROM 21. When it is desired to display a screen, the corresponding text data is retrieved from the screens portion of ROM 21 and converted character generation control data. The character generation control data is accumulated in a display buffer portion of RAM 23 and thereafter coupled to character generator 25.

A number of screens which are sequentially displayed as a user progresses through a control operation may be required for various control functions or features. For example, the user may be guided through a control operation by hierarchical menus which are sequentially displayed as the user operates keys of user control unit 17. While such OSD provisions are extremely important to enable the user to control the numerous and complex functions and features, it requires a very large amount of text data. This tends to increase the size (and therefore cost) of ROM 21 or limit the memory space available for the control functions, or both.

As earlier noted, statistical text data compression techniques may be utilized to reduce the amount of text data that needs to be stored. These techniques make use of the recognition that screens for guiding a user to use the various functions and features of a television receiver typically contain several common text stings and sub-strings. By way of example, the text data for the most frequently used text strings may be stored in uncompressed form in a "dictionary" portion of ROM 21. Each of the dictionary entries is identified by a unique dictionary entry representative code word which does not correspond to any of the character representative (e.g., ASCII) code words. Each time the dictionary entry is encountered in a screen it is replaced by the respective dictionary entry representative code word.

The dictionary entry representative code words correspond to addresses of respective memory locations of the dictionary portion of ROM 21 which contain uncompressed text data representing various commonly used text strings. As a text data for a screen is assembled, each time a dictionary entry representative code word is encountered in the screen portion of ROM 21, the respective uncompressed text data is read out of the dictionary portion of ROM 21. As a result, the amount of memory space of ROM 21 required for the text screens is considerably reduced.

While statistical data compression techniques reduce the amount of text data which needs to be stored, further reductions are desirable to maximize the availability of memory space for additional control functions and to minimize the size (and therefore the cost) of the memory for consumer electronics product applications. The present invention takes advantage of the fact that the screens for guiding a user to use consumer electronics products such as television receivers contain text strings and sub-strings which are identical except for formats, such as the use of all upper case letters, which are used to selectively emphasize or highlight these strings and sub-strings in various screens. More specifically, the invention uses a special format change code word to indicate a change of format, such as a change from lower case or mixed case to upper case. In this regard it is noted that in ASCII code, the upper and lower case versions of the same letter are represented by two different code words. The format change control word is stored adjacent to, for example, just prior to, the text data representing a first text string in order to represent a second string which is identical to the first string except for a change in format. Whenever the format change code word is encountered, the adjacent text data representing the first string is converted to the text data representing the second string. As a result, rather than requiring the storage of text data representing each character of the lower or mixed case first text string and also the upper case second text string, it is only necessary to store the text data representing each character of the first string by itself when the first string is to be displayed and together with the format change code word when the second string is to be displayed. Mathematically, this means that if each of the first and second text strings contain N characters, it is only necessary to store N+1 bytes rather than 2N bytes for the two strings.

While the format change code word may be used just for the text data in the screen portion of ROM 21, another aspect of the invention concerns the use of the of the format change code word within the dictionary portion of ROM 21 to produce an additional reduction of text which has to be stored.

The following table indicates some examples of text data compression in accordance with the present invention. In the table, the following coding symbols are used:

XXX
   indicates text data representing the text string XXX

[UI_XXX]
   indicates an eight-bit dictionary entry code word corresponding to the XXX text string

[UPPER_NEXT]
   indicates the one-byte format change code word for causing the text represented by the following text data to be converted from lower or mixed case to upper case —
   indicates one character space in the labels for code words

| EXAMPLE | UNCOMPRESSED TEXT DATA | COMPRESSED TEXT DATA |
| --- | --- | --- |
| 1 | Antenna_A | [UI_Antenna]_A |
| 2 | Antenna_B | [UI_Antenna]_B |
| 3 | Ant | not compressed |
| 4 | ANT | [UPPER_NEXT]Ant |
| 5 | Audio | [UI_Audio] |
| 6 | AUDIO | [UPPER_NEXT][UI_Audio] |
| 7 | AUDIO PROCESSOR | [UPPER_NEXT][UI_Audio] Process[UI_or] |

Examples 1 and 2 correspond to the use of the dictionary to compress the text data for the frequently encountered word "Antenna". With reference to example 1, when the dictionary entry code word [UI_Antenna] is encountered in the text data stored in the screen portion of ROM 21, the memory location of the dictionary portion of ROM 21 which contains the uncompressed text data which represents the word "Antenna" is addressed and the contents are retrieved and used to generate the character generation control data for the word "Antenna". Thereafter, when the uncompressed text data representing the letter "A" is encountered, the character generation control data for the letter "A" is directly generated. In this way the text string "Antenna A" is displayed. The text string "Antenna B" is displayed in the same manner, as is indicated by example 2.

Examples 3 and 4 correspond to the use of the format change control word for causing a change from lower or mixed case to upper case when a dictionary entry is not involved. The word "Ant", which is an abbreviation for the word "Antenna", is not frequently used in the screens and therefore does not have a dictionary entry, as is indicated by example 3. To represent the word "ANT", which is the upper case version of the word "Ant", it is possible to use the upper case change code word [UPPER_NEXT] immediately preceding the uncompressed text data representing the word "Ant", as is indicated by example 4. However, depending on the number or times the word "ANT" is used in the screens and because the word "ANT" contains only three characters, it may be more practical to simply store text data directly representing the word "ANT".

Examples 5 and 6 correspond to the use of the format change control word for causing a change form lower or mixed case to upper case when a dictionary entry is involved. The word "Audio" is frequently used in the screens and therefore has a dictionary entry, as is indicated by example 5. To represent the word "AUDIO", which is the upper case version of the word "Audio", the upper case change code word [UPPER_NEXT] immediately precedes the dictionary entry code word [UI_Audio] corresponding to "Audio", as is indicated by in example 6.

Example 7 corresponds to the use of the format change control word for causing a change form lower or mixed case to upper case when a word in the dictionary entry and a word not in the dictionary are both involved. The word "Audio" and the suffix "or" are both used frequently in the screens and therefore have respective dictionary entry code words [UI_Audio] and [UI_or]. However, the word "Process" is not frequently used and therefore does not a dictionary entry code word. The text string "Audio Processor" is represented by [UI_Audio] Process[UI_or], and the text string "AUDIO PROCESSOR" is represented by [UPPER_NEXT][UI_Audio] Process [UI_or].

Figure 2:
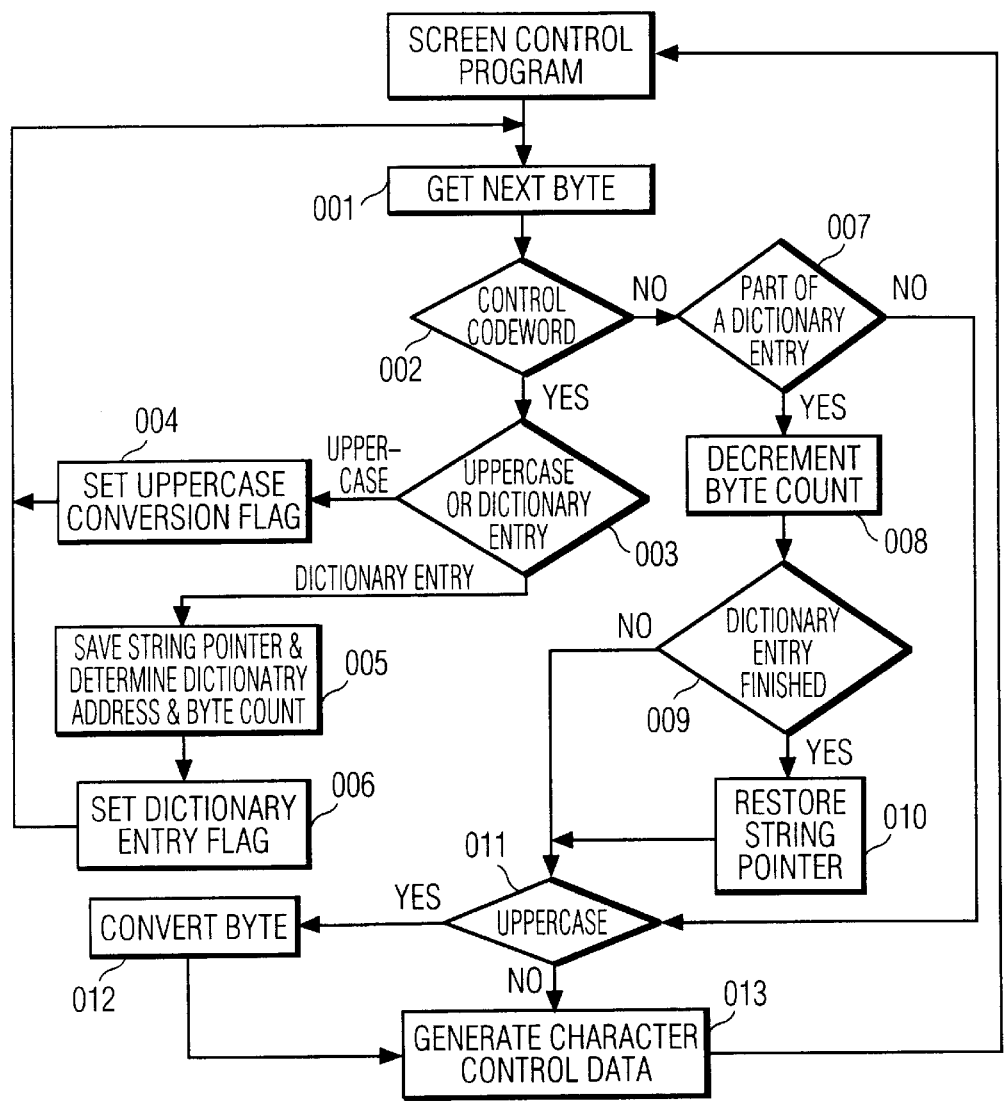
FIG. 2 is a flow chart of a method of retrieving text data, decompressing text data in accordance and presenting text for display by the OSD system shown in FIG. 1 in accordance with another aspect of the invention.

Upper case format change control word [UPPER_NEXT] will cause each byte representing a letter of the succeeding text data directly representing a text string (after retrieval from the dictionary portion of ROM 21 if necessary) to be converted to represent the upper case version of the letter one byte at time. Therefore it is necessary to be able to determine the end of text data representing a complete text string. The end of a text string is indicated by a special end of text string code word (e.g., 0 in hexadecimal code) in the screens portion of ROM 21. However, the end of text string code word is not used in the dictionary portion of ROM 21. Instead, the number of bytes (characters) contained in the text string is stored for each dictionary entry and the end of the text string is determined by counting the number of bytes which have been processed. These and other aspects of the text data decompression process will be described in detail with reference to the flow chart of the text data decompression portion of the control program stored in ROM 21 shown in FIG. 2.

As earlier noted the information to be displayed is organized by screens comprising one or more text strings. The text data for the screens is stored in ROM 21. When a screen is to be displayed, the text data for the various text strings of the screen are sequentially processed in accordance with a screen control program (indicated by one block in FIG. 2) until the text data for all of the text strings have been processed. The screen control program causes each byte of text data corresponding to a text string to be read out of the screens portion of ROM 21 and to be processed according to the text decompression program(indicated in the remaining portion of FIG. 2) one byte at a time until the end of the string is reached. The end of a text string is indicated by the special end of text string code word. Thereafter, the text data for the next text string is processed.

The next byte to be processed is retrieved in step 001 and examined in step 002 to determine whether or not it is a control code word. If the byte is a control code word, the byte is examined in step 003 to determine if it is the upper case format change code word or a dictionary entry code word. If the byte being examined is the upper case format change code word, a upper case flag is set to indicate this occurrence is set in step 004 and the next byte is retrieved in step 001. If the byte being examined is a dictionary entry code word, the address of the next byte in the screens portion of ROM 21 is saved in a string pointer register and the address of the respective text string in the dictionary portion of ROM 21 and the number of bytes (characters) in the respective text string are determined in step 005. It is necessary to save the address of the next byte in the screens portion of ROM 21 because the same address register of CPU 19 is used for both the screens and dictionary portions of ROM 21. The address and number of characters in the text string are determined from a look-up table also stored in the dictionary portion of ROM 21. Thereafter, a dictionary entry flag is set in step 006 to indicate that code word is a dictionary entry code word and the next byte is retrieved in step 001.

If the byte being examined is a not a code word (step 002), it is determined whether or not the byte being examined is part of a dictionary entry in step 007. This is accomplished by examining the state of the dictionary entry flag. If the byte being examined is part of a dictionary entry, the contents of a character count register containing the number of bytes (characters) in the dictionary entry is decreased by one in step 008. Thereafter, it is determined whether or not the end of the dictionary entry has been reached in step 009 by determining if the contents of the byte (character) count register have reached zero. If the end of the dictionary entry has been reached, the contents of the string pointer register are used to set the address register in step 010 to indicate the address of the next byte in the screens portion of ROM 21.

If the end of the dictionary entry has not been reached (step 009) or after the contents of the address register have been set to indicate the next byte in the screens portion of ROM 21 (step 010), it is determined whether or not upper case format change code word preceded the text data representing dictionary entry string in step 011 by determining whether or not the upper case flag has been set. If the upper case flag has been set, the byte being processed is converted to the byte representing the upper case version of the letter which the byte being processed represents in step 012. This may be accomplished by adding an offset value to the byte being processed if ASCII code is being utilized or by means of a look-up table. The conversion does not take place if the byte being processed already represents an upper case letter. If the upper case flag has not been set (step 011) or after the upper case code conversion (step 012), the character generation control data for character generator 25 is generated in step 013.

If the byte being examined is a not a code word (step 002) and is not a part of a dictionary entry (step 007), it is immediately determined whether or not the upper case format change code word preceded the string representative text data in the screens portion of ROM 21 in step 011. In the same manner indicated above, if the upper case flag has not been set (step 011) or after the upper case code conversion (step 012), the character generation control data for character generator 25 in step 013.

The use of the dictionary technique has several advantages over other types of data compression techniques such as the Huffman decoding. It utilizes text data which is easily recognized and manipulated. It allows a text data decoding procedure which passes uncompressed text data through transparently thereby eliminating the need for separate text decoding processes for compressed and uncompressed text data. Accordingly, computational steps and processing time tend to be minimized. The saving in computational steps, in addition to the actual data compression, makes memory space available for additional control functions and features.

The integration of the format change control coding with the dictionary coding increases compression efficiency by eliminating text string and sub-string duplication.

The storage of the text data for the various text screens in ROM 21 occurs during the manufacturing process. The text data compression may be manually performed by a computer programmer who analyses the raw text and determines which text strings and sub-strings occur frequently enough to be included in the dictionary and which text strings and sub-strings require the upper case conversion code word. Alternatively, the text compression may be performed, all or in part, by a computer program. The flow chart for such a computer program is shown in FIG. 3.

Figure 3:
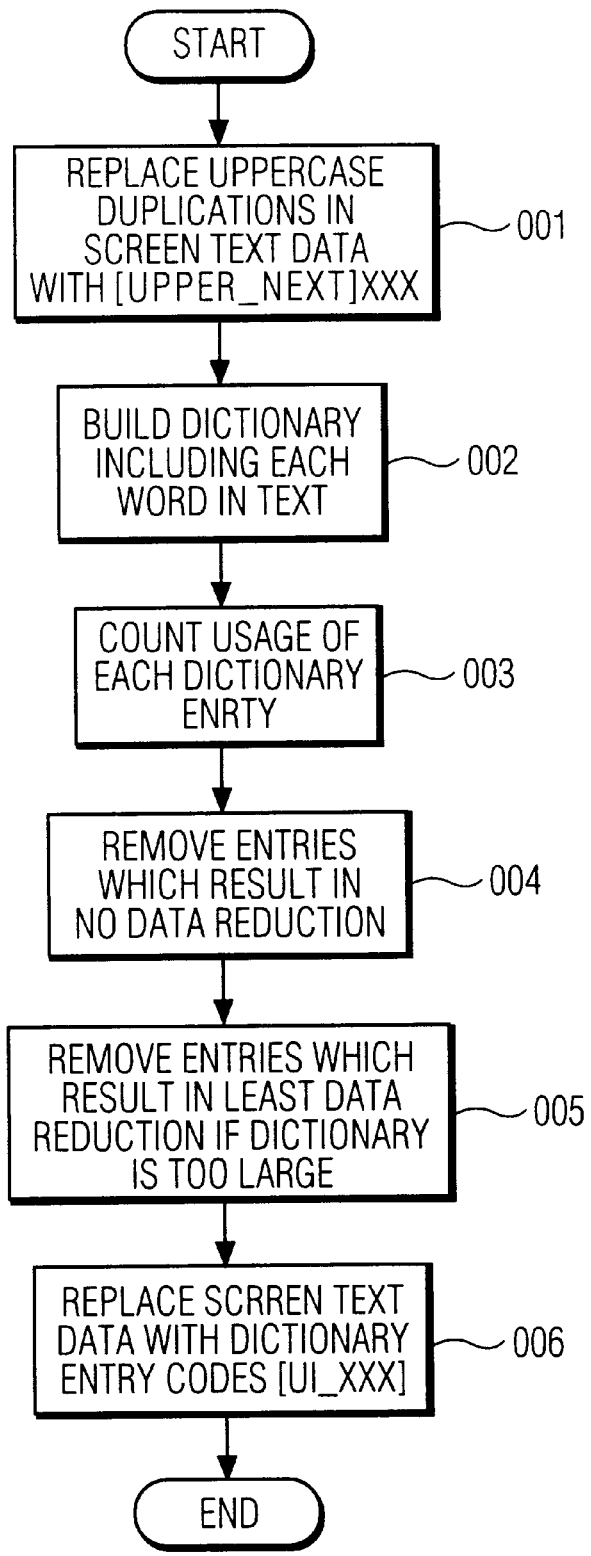
FIG. 3 is a flow chart of a method of compressing text data for storage in the OSD system shown in FIG. 1 in accordance with another aspect of the invention.

Steps 001 through 003 and 006 of the flow chart shown in FIG. 3 are self explanatory. Step 004, which concerns removal of dictionary entries which do not result text data reduction, involves removing entries which only occur once or are only one character long. Step 005 involves an evaluation of the number of entries versus the available number of dictionary entry code words. For example, there 256 ($2^8$) unique code words possible when eight bits are used. Of the 256 possible code words, 128 are required for ASCII characters, including upper case letters which must be stored for mixed case text strings, or are ASCII control words. Therefore, if there are more than 128 dictionary entries, some must be removed. Determining the entries which should be removed involves an evaluation of how often the text strings represented by the code words occur in the text screens and the number of characters each contains. The entries which should be removed are those which occur least frequently or which contain the fewest number of characters.

While the present invention has been described with reference to a television receiver, it will be appreciated that the invention is applicable to other types of consumer electronics products, such as video disc players and video game equipment, for which cost and therefor the desire to limit the memory size are a concern. For that matter, the invention is applicable to any system for which it is desirable to display a significant amount of text information for facilitating the use of various features and functions and yet limit the memory size.

While the present invention has been described in terms of text compression which utilizes a format change code word to represent a change from all lower case or mixed case text to upper case text, other format change code words to represent a different type of format change of case may be utilized. For example, a format change code word may be utilized to indicate that the first letter of each word of a text string should be capitalized to form a title case version. In similar fashion, other format change code words may be utilized to indicate a change of format other than a change of case, such as from un-underlined text to underlined text, from un-italicized text to italicized text or from normal text to boldface text. Still further, other format change code words may be used to indicate a change in font style or size. In addition, while a dictionary type of text data compression has been described with reference to the preferred embodiment, other type of statistical text data compression techniques may be utilized.

While the present invention has been described in with reference to a format change code word which precedes the text data representing the text to be converted, the format change code word may also follow the text data representing the text to be converted.

While the present invention has been described in terms of a compression technique in which a format type of text data compression is used in an integrated manner with another type of text compression technique, the format type of text data compression may be utilized separate from the other type of text data compression or by itself.

While the present invention has been described in terms of an on-screen display (OSD) system in which the text information is displayed by the same display device which is used to display a video image, the invention may also be used in a product including a display device which is especially provided for displaying operating information.

The above mentioned and other modifications are contemplated to be within the scope of the invention defined by the following claims.

We claim:

1. In a system having a plurality of controllable functions, apparatus comprising:

means for storing text data representing text information for guiding a user in controlling said functions; said text information including a first string of text and a second string of text identical to said first string of text except for a change of format; said second string of text represented by a format change code word associated with text data representing said first string of text;

means for retrieving said text data from said storing means, converting the text data representing said first string of text to text data representing said second string of text when said format change code word is associated with said text data representing said first string of text; and means for generating text representative signals capable of causing the display of said text information by a display device in response to said text data provided by said retrieving means.

2. The apparatus recited in claim 1, wherein:

said format change code word indicates a change of one of case, underlining, italicization, style or size.

3. The apparatus recited in claim 2, wherein:

said format change code word indicates a change between lower case or mixed case to all upper case.

4. The apparatus recited in claim 2, wherein:

said format change code word indicates a change resulting in the capitalization of the first letter of the first word in said string.

5. The apparatus recited in claim 1, wherein:

said first string of text occurs relatively frequently within said text information and is represented by a text string representative code word which contains less bits than said text data representing said first text string; and said retrieving means converting said text string representative code word into said text data representing said first string and converting said text string representative code word into said text data representing said second text string when said format change coded word is associated with said text string representative code word.

6. The apparatus recited in claim 5, wherein:

said format change code word indicates a change of one of case, underlining, italicization, style or size.

7. The apparatus recited in claim 6, wherein:

said format change code word indicates a change between lower case or mixed case to all upper case.

8. The apparatus recited in claim 6, wherein:

said format change code word indicates a change resulting in the capitalization of the first letter of the first word in said string.

9. The apparatus recited in claim 5, wherein:

said text string representative code word corresponds to an address of a memory location of said storage means which contains said text data representing said first text string.

10. A method of processing text data representing text information for guiding a user in controlling various functions of a system, said text information including a first string of text and a second string of text identical to said first string of text except for a change of format, comprising the steps of:

representing said second string of text by a format change code word associated with the text data representing said first string of text in a memory;

retrieving said text data from said memory including the step of converting the text data representing said first string of text to text data representing said second string of text when said format change code word is associated with said text data representing said first string of text; and generating text representative signals capable of causing the display of said text information by a display device in response to said retrieved text data.

11. The method recited in claim 10, wherein:

said format change code word indicates a change of one of case, underlining, italicization, style or size.

12. The method recited in claim 11, wherein:

said format change code word indicates a change between lower case or mixed case to all upper case.

13. The method recited in claim 11, wherein:

said format change code word indicates a change resulting in the capitalization of the first letter of the first word in said string.

14. The method recited in claim 10, wherein:

said first string of text occurs relatively frequently within said text information and is represented by a text string representative code word which contains less bits than said text data representing said first text string; and said retrieving step includes the step of converting said text string representative code word into said text data representing said first string and converting said text string representative code word into said text data representing said second text string when said format change coded word is associated with said text string representative code word.

15. The method recited in claim 14, wherein:

said format change code word indicates a change of one of case, underlining, italicization, style or size.

16. The apparatus recited in claim 15, wherein:

said format change code word indicates a change between lower case or mixed case to all upper case.

17. The method recited in claim 15, wherein:

said format change code word indicates a change resulting in the capitalization of the first letter of the first word in said string.

18. The method recited in claim 14, wherein:

said text string representative code word corresponds to an address of a memory location of said memory which contains said text data representing said first text string.

19. In a system having a plurality of controllable functions, apparatus comprising:

means for storing text data representing text information for guiding a user in controlling said functions; said text information including a first string of text and a second string of text identical to said first string of text except for a change of format; said first string of text is represented by a text string representative code word corresponding to an address of a memory location of said storage means which contains text data representing said first text string; said second string of text being represented by a format change code word associated with said text string representative code word;

means for retrieving said text data from said storing means; said retrieving means utilizing said text string representative code word to address said memory location containing said text data representing said first string and converting said text data representing said first text string into text data representing said second text string when said format change coded word is associated with said text string representative code word; and means for generating text representative signals capable of causing the display of said text information by a display device in response to said text data provided by said retrieving means.

20. The apparatus recited in claim 19, wherein:

said format change code word precedes said text representative code word.

* * * * *